United States Patent
Yu et al.

(10) Patent No.: US 7,015,725 B1
(45) Date of Patent: Mar. 21, 2006

(54) DELAY-LOCKED LOOP DEVICE CAPABLE OF ANTI-FALSE-LOCKING

(75) Inventors: Ming-Shih Yu, Taipei Hsien (TW); Yuh-Kuang Tseng, Tao-Yuan Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 10/904,944

(22) Filed: Dec. 6, 2004

(51) Int. Cl.
*H03L 7/06* (2006.01)

(52) U.S. Cl. .................... 327/12; 327/158; 331/DIG. 2

(58) Field of Classification Search ........ 327/156–158, 327/147, 2, 12; 331/DIG. 2, 1 A, 25
See application file for complete search history.

(56) References Cited

U.S. PATENT DOCUMENTS

| | | | | |
|---|---|---|---|---|
| 5,180,993 A | * | 1/1993 | Dent ........................... | 331/16 |
| 5,530,383 A | * | 6/1996 | May ............................ | 327/39 |
| 5,909,130 A | * | 6/1999 | Martin et al. ................. | 327/12 |
| 5,969,576 A | * | 10/1999 | Trodden ...................... | 331/1 A |
| 6,844,761 B1 | * | 1/2005 | Byun et al. .................. | 327/149 |
| 6,963,234 B1 | * | 11/2005 | Bidenbach ................... | 327/158 |

* cited by examiner

*Primary Examiner*—Dinh T. Le
(74) *Attorney, Agent, or Firm*—Winston Hsu

(57) ABSTRACT

A delay-locked loop device capable of anti-false-locking includes a voltage control delay circuit including a plurality of delay units in a series for generating a delayed phase according to a reference phase and a control voltage; a phase detector coupling to the voltage control delay circuit for generating a control signal according to a lock indication signal, the reference phase, and the delayed phase; a charge pump coupling to the phase detector for generating the control voltage to the voltage control delay circuit according to the control signal; and a lock detector coupling to the voltage control delay circuit for generating the lock indication signal for the phase detector according to output phases of each delay unit of the voltage control delay circuit.

7 Claims, 12 Drawing Sheets

| | Q1 | Q2 | Q3 | Q4 | Under | Right | Over |
|---|---|---|---|---|---|---|---|
| L1 | 0 | 0 | 0 | 0 | 1 | 0 | 0 |
| L2 | 0 | 0 | 0 | 1 | 0 | 1 | 0 |
| L3 | 0 | 0 | 1 | 0 | 0 | 1 | 0 |
| L4 | 0 | 0 | 1 | 1 | 0 | 1 | 0 |
| L5 | 0 | 1 | ∅ | ∅ | 0 | 0 | 1 |
| L6 | 1 | 0 | ∅ | ∅ | 0 | 0 | 1 |
| L7 | 1 | 1 | ∅ | ∅ | 0 | 0 | 1 |

∅ = Don't care

Fig. 5 Prior art

DELAY-LOCKED LOOP DEVICE CAPABLE OF ANTI-FALSE-LOCKING

BACKGROUND OF INVENTION

1. Field of the Invention

The present invention relates to a delay-locked loop device, and more particularly, a delay-locked loop device capable of anti-false-locking and increasing the operating range with a lock detector.

2. Description of the Prior Art

Digital integrated circuits have been highly developed. Personal computers, mobile phones, digital watches, and calculators, for example, are applications of digital integrated circuits. With high-speed, microminiaturized, and multi-function developments, a complex digital integrated circuit often includes a plurality of units. The units delay a reference timer with different degrees, so a delay-locked loop (DLL) device is need for maintaining synchronization of the digital integrated circuit.

Please refer to FIG. 1, which illustrates a schematic diagram of a prior art DLL device 10. The DLL device 10 includes a phase detector 12, a charge pump 14, a loop filter 16, a voltage control delay circuit 18, and a reference-phase generator 20. The reference-phase generator 20 generates a reference phase Fr for the voltage control delay circuit 18 and the phase detector 12. The voltage control delay circuit 18 includes a plurality of delay units 22 each controlled by a voltage Vc provided by the loop filter 16 to delay the reference phase Fr. The voltage control delay circuit 18 delays the reference phase Fr according to the voltage Vc provided by the loop filter 16, and outputs a delayed phase Fd to the phase detector 12 from the last-stage delay unit 22 of the voltage control delay circuit 18. The phase detector 12 generates a phase difference between the reference phase Fr and the delayed phase Fd, then determines whether the voltage control delay circuit 18 delays the reference phase Fr with a predetermined value, and controls the charge pump 14 to increase or decrease output charges for the loop filter 16 according to the phase difference. The loop filter 16 transforms the charges provided by the charge pump 14 to the voltage Vc for controlling the delay amount (degree) of the delayed phase Fd corresponding to the reference phase Fr. That is, each delay unit 22 of the voltage control delay circuit 18 delays the reference phase Fr with an amount, and the last delay unit 22 outputs the delayed phase Fd to the phase detector 12, which determines the phase difference between the reference phase Fr and the delayed phase. For example, if one cycle delay is needed, but the phase difference between the reference phase Fr and the delayed phase Fd is greater than a cycle (or 360°), the phase detector 12 triggers the charge pump 14 to increase output charges for the loop filter 16, so as to output a larger voltage Vc to each delay unit 22 of the voltage control delay circuit 18. The larger voltage Vc causes each delay unit 22 decreasing the delay amount, so the phase difference between the delayed phase Fd and the reference phase Fr decreases. On the other hand, in this case, if the phase difference between the reference phase Fr and the delayed phase Fd is smaller than a cycle, the phase detector 12 triggers the charge pump 14 to decrease output charges for the loop filter 16, causing a smaller voltage Vc and a larger delay amount of each delay unit 22 accordingly, so the phase difference between the delayed phase Fd and the reference phase Fr increases. Therefore, with a close loop 24 shown in FIG. 1, the DLL device 10 outputs the delayed phase Fd from the last delay unit 22 of the voltage control delay circuit 18 to a system for synchronization.

However, the operations of the prior art DLL device 10 are limited by effects of harmonic lock and stuck lock. Please refer to FIG. 2, which illustrates a waveform diagram of a lock range of the DLL device 10. In FIG. 2, a cycle Tr represents a cycle of the reference phase Fr generated by the reference-phase generator 20 in FIG. 1; durations Tmax and Tmin represent the maximum and the minimum delay ranges of the delayed phase Fd; a waveform Wr represents a waveform of the reference phase Fr; waveforms Wd,max and Wd,min represent waveforms of the delayed phase Fd in the maximum and the minimum delays. What is so-called "harmonic lock" is that because the phase detector 12 of the DLL device 10 only detects the phase difference between the delayed phase Fd and the reference phase Fr, wrong decisions of the phase detector 12 occur when a delayed phase generated by the voltage control delay circuit 18 is integer times the phase difference between the needed delayed phase Fd and the reference phase Fr. For example, when a phase Fd delaying 2Tr is needed, the phase detector 12 of the DLL device 10 sets the phase difference between the delayed phase Fd and the reference phase Fr being 720°, and controls the charge pump 14 to increase or decrease charges for the loop filter 16. However, when the phase difference between the delayed phase Fd and the reference phase Fr is 1440° (that is, the phase Fd delays 4Tr), the phase detector 12 determines that the DLL device 10 has locked accurately (for 1440°=2×720°). In order to prevent the effect of harmonic lock, the maximum lock range of the DLL device 10 is limited to Tmax. Moreover, the process of reaching lock also limits the minimum lock range of the DLL device 10 as Tmin. In short, because of the effects of harmonic lock and stuck lock, the lock ranges of the prior art DLL device 10 should be Tr<Tmax<1.5Tr and 0.5Tr<Tmin<Tr. Nevertheless, the limitations of the lock ranges cannot conform to some applications, and may cause false lock.

To improve the above-mentioned problems, the prior art uses a lock detector. Please refer to FIG. 3, which illustrates a schematic diagram of a prior art DLL device 30. The DLL device 30 includes a phase detector 32, a charge pump 34, a loop filter 36, a voltage control delay circuit 38, a reference-phase generator 40, and a lock detector 46. The reference-phase generator 40 generates a reference phase Fref for the voltage control delay circuit 38 and the phase detector 32. The voltage control delay circuit 38 includes a plurality of delay units 42 each controlled by a voltage Vct provided by the loop filter 36 to delay the reference phase Fref. The voltage control delay circuit 38 delays the reference phase Fref according to the voltage Vct provided by the loop filter 36, and outputs a delayed phase Fdl to the phase detector 32 from the last-stage delay unit 42 of the voltage control delay circuit 38. The lock detector 46 outputs a lock indication signal Sp to the phase detector 32 according to the reference phase Fref and each phase of the delay units 42 of the voltage control delay circuit 38. The lock indication signal Sp includes an under, a right, and an over signals for indicating the phase detector 32 whether the delayed phase Fdl is under, right, or over delay. After receiving the lock indication signal Sp, the phase detector 32 determines whether the delayed phase Fdl delays in a specific range (for avoiding the harmonic lock and the stuck lock), and controls the delayed phase Fdl with a close loop according to a phase difference between the delayed phase Fdl and the reference phase Fref. As to the configuration of the lock detector 46, please refer to FIG. 4, which illustrates a schematic diagram of the lock detector 46 of the prior art DLL device 30 in FIG. 3. The lock detector 46 includes a state machine 48 and a serial shift register set. The serial shift register set 50 includes a plurality of D flip-flops 52. Each of the D flip-flops 52 corresponds to each delay unit 42 of the voltage control delay circuit 38, and is triggered by rising edges of the reference phase Fref to sample output signals (CK1~CKN) of the delay units 42 of the voltage control delay circuit 38, so as to output a sequence of signals Q1, Q2 to Qn for the state machine 48. The state machine 48 generates a truth table according to the sequence of the signals Q1 to Qn, and outputs the lock indication signal Sp to the phase detector 32. For example, if the voltage control delay circuit 38 includes four delay units 42, the lock detector 46 includes four corresponding D flip-flops 52, and a truth table shown in FIG. 5 is obtained according to a predetermined delay amount (such as one cycle). In FIG. 5, a row L1 represents that the output signals Q1 to Q4 generated by sampling the delay units 42 with the rising edges of the reference phase Fref delaying one cycle are 0. That is, the signals sampled by the rising edges of the reference phase Fref are low level, so the delayed phase Fdl outputted from the last delay unit 42 delays the reference phase Fref with a delay amount smaller than the predetermined delay amount (one cycle). As a result, the under signal of the lock indication signal Sp is set to be 1, representing that the delay amount between the delayed phase Fdl and the reference phase Fref is under (smaller than) the predetermined delay amount (one cycle), so as to indicate the phase detector 32 not to lock the false phase and to control the delayed phase Fdl by adjusting output charges for the charge pump 34 accordingly. By the same token, rows L2 to L4 in FIG. 5 represent that the delay amount between the delayed phase Fdl and the reference phase Fref almost equals the predetermined delay amount, and the right signal of the lock indication signal Sp is set to be 1. Therefore, the phase detector 32 determines that the delay amount of the delayed phase Fdl is in an right range, and controls the delayed phase Fdl with a close loop 44 for maintaining the right delay lock according to the phase difference between the delayed phase Fdl and the reference phase Fref. Moreover, in FIG. 5, rows L5 to L7 represent that the delay amount between the delayed phase Fdl and the reference phase Fref is over the predetermined delay amount (one cycle), so that the over signal of the lock indication signal Sp is set to be 1 for indicating the phase detector 32 not to lock the false phase and to control the delayed phase Fdl by adjusting output charges for the charge pump 34 accordingly.

Therefore, using the lock detector 46, the DLL device 30 detects every delay unit 42 of the voltage control delay circuit 38 for generating a truth table, and indicates the phase detector 32 not to lock false phases according to the truth table, avoiding harmonic lock and stuck lock. However, in high-precision applications, the precise delayed phase Fdl is needed. As a result, the DLL device 30 increases the delay units 42 of the voltage control delay circuit 38, and the corresponding D flip-flop 52 of the serial shift register set 50, causing a huge truth table in the state machine 48 occupying more system resources. Moreover, each unit (or block) in a system uses the DLL device for synchronization, so in the high-precision applications, the DLL devices cost a lot of resources further. Besides, when the reference-phase generator affected by noises generates the reference phase Fref having jitters, or having an asymmetric duty cycle (that is, the duty cycle differ from 50%), a false lock occurs in the DLL device 30. For example, please refer to FIG. 6 (also FIG. 5), which illustrates a waveform diagram of the reference phase Fref and output signals of the delay units 42 when the voltage control delay circuit 38 in FIG. 4 includes four delay units 42 and the duty cycle of the reference phase Fref is 70%. In FIG. 6, a signal Wref is the waveform of the reference phase Fref, and signals Wck1 to Wck4 are waveforms of output signals of the first to the fourth delay units 42. If a one-cycle delay amount between the delayed phase Fdl and the reference phase Fref is needed, the phase detector 32 can delay the reference phase Fref with one cycle accurately when the output signals Q1 to Q4 generated by sampling the delay units 42 with the rising edges of the reference phase Fref delaying one cycle conform to the rows L2 to L4 of the truth table in FIG. 5. However, as shown in FIG. 6, when the duty cycle of the reference phase Fref is 70%, the output signal Wck4 of the fourth delay unit 42 does not delay with the needed one cycle in comparison with the signal Wref, but owing to the 70% duty cycle of the reference phase Fref, the output signal (or Q4) of sampling the fourth delay unit 42 with the rising edges of the reference phase Fref delaying one cycle is high level (or logic 1), meaning that the DLL device 30 is in the right delay lock according to the row L2 in FIG. 5. In short, when the duty cycle of the reference phase Fref is greater than 50%, error delays may occur in the prior art DLL device 30. By the same token, please refer to FIG. 7, which illustrates a waveform diagram as shown in FIG. 6, but the duty cyle of the reference phase Fref is 30%. Owing to the 30% duty cycle of the reference phase Fref, the situation in FIG. 7 conforms to the row LI in FIG. 5, or under lock, but actually, the DLL device 30 is in the right delay lock.

In summary, the prior art DLL device 10 cannot detect harmonic lock and stuck lock, and although the prior art DLL device 30 can detect them, the DLL device 30 costs a lot of system resources as the delay units 42 increase. Moreover, as shown in FIG. 5, the lock range of the DLL device 30 is between the rows L2 to L4 and is limited between 0.5 and 1.5 cycles of the reference phase Fref. Furthermore, the DLL device 30 can only operate with the 50% duty cycle of the reference phase. Therefore, the prior art DLL device costs system resources, but is incapable of achieving accurate delay locks, and the system may be unstable in synchronization when suffering noises or other affections.

SUMMARY OF INVENTION

Therefore, the present invention provides a DLL device capable of anti-false-locking.

According to the claimed invention, a delay-locked loop device capable of anti-false-locking includes a voltage control delay circuit including a plurality of delay units in a series for generating a delayed phase according to a reference phase and a control voltage; a phase detector coupling to the voltage control delay circuit for generating a control signal according to a lock indication signal, the reference phase, and the delayed phase; a charge pump coupling to the phase detector for generating the control voltage to the voltage control delay circuit according to the control signal; and a lock detector coupling to the voltage control delay circuit for generating the lock indication signal for the phase detector according to output phases of each delay unit of the voltage control delay circuit. The lock detector includes a first shift register set including a plurality of shift registers each corresponding to a delay unit of the voltage control delay circuit for generating a first sequence of comparison signals according to a first divided phase and the output phases of each delay unit of the voltage control delay circuit; a second shift register set including a plurality of shift registers each corresponding to a shift register of the first shift register set for generating a second sequence of comparison signals according to a second divided phase and the first sequence of the comparison signals; and a logic module coupling to the second shift register set for generating the lock indication signal according to the second sequence of the comparison signals.

These and other objectives of the present invention will no doubt become obvious to those of ordinary skill in the art after reading the following detailed description of the preferred embodiment that is illustrated in the various figures and drawings.

BRIEF DESCRIPTION OF DRAWINGS

FIG. 5 illustrates a truth table of the lock detector in FIG. 4.

DETAILED DESCRIPTION

Figure 1:
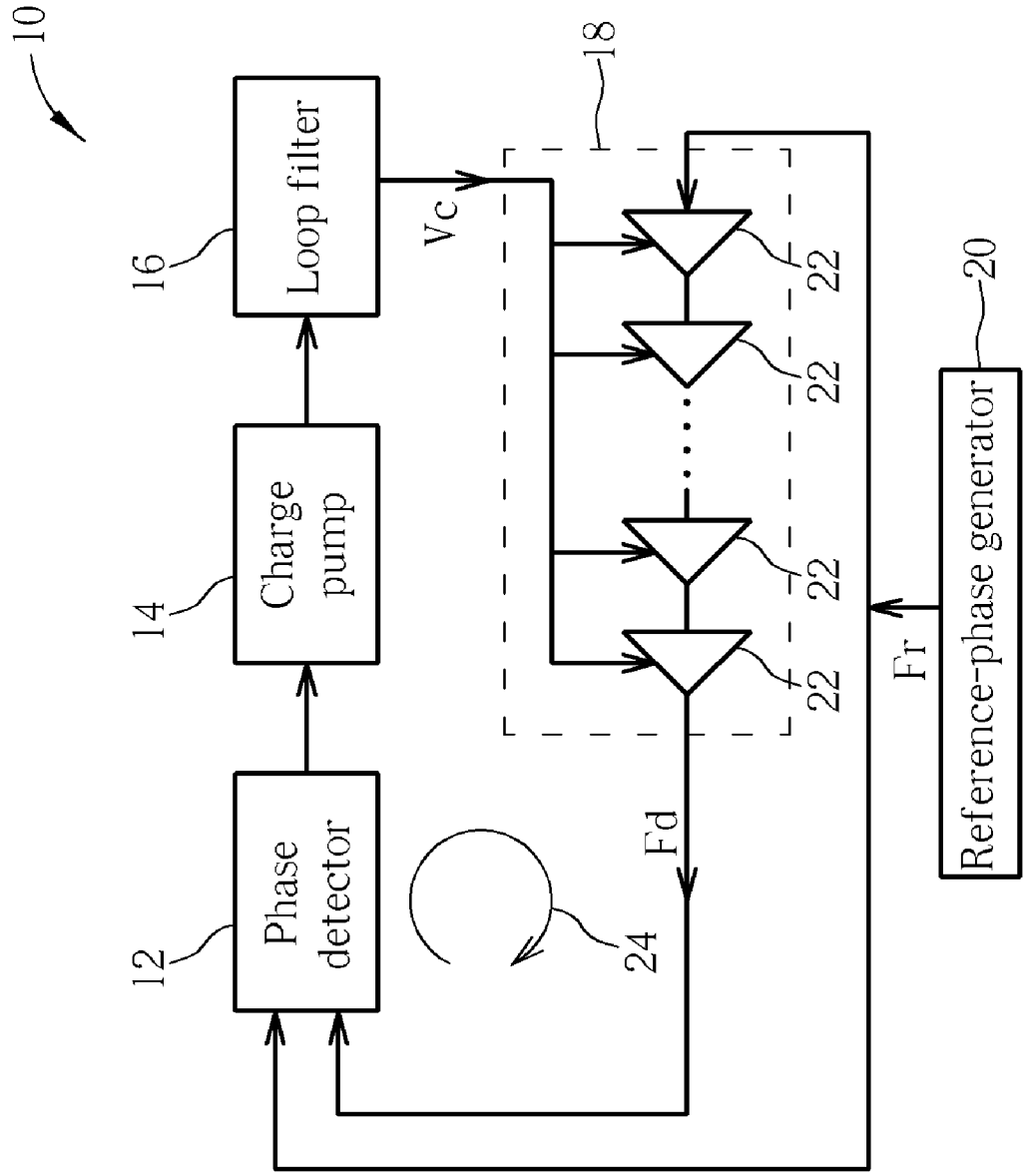
FIG. 1 illustrates a schematic diagram of a prior art DLL device.
Figure 2:
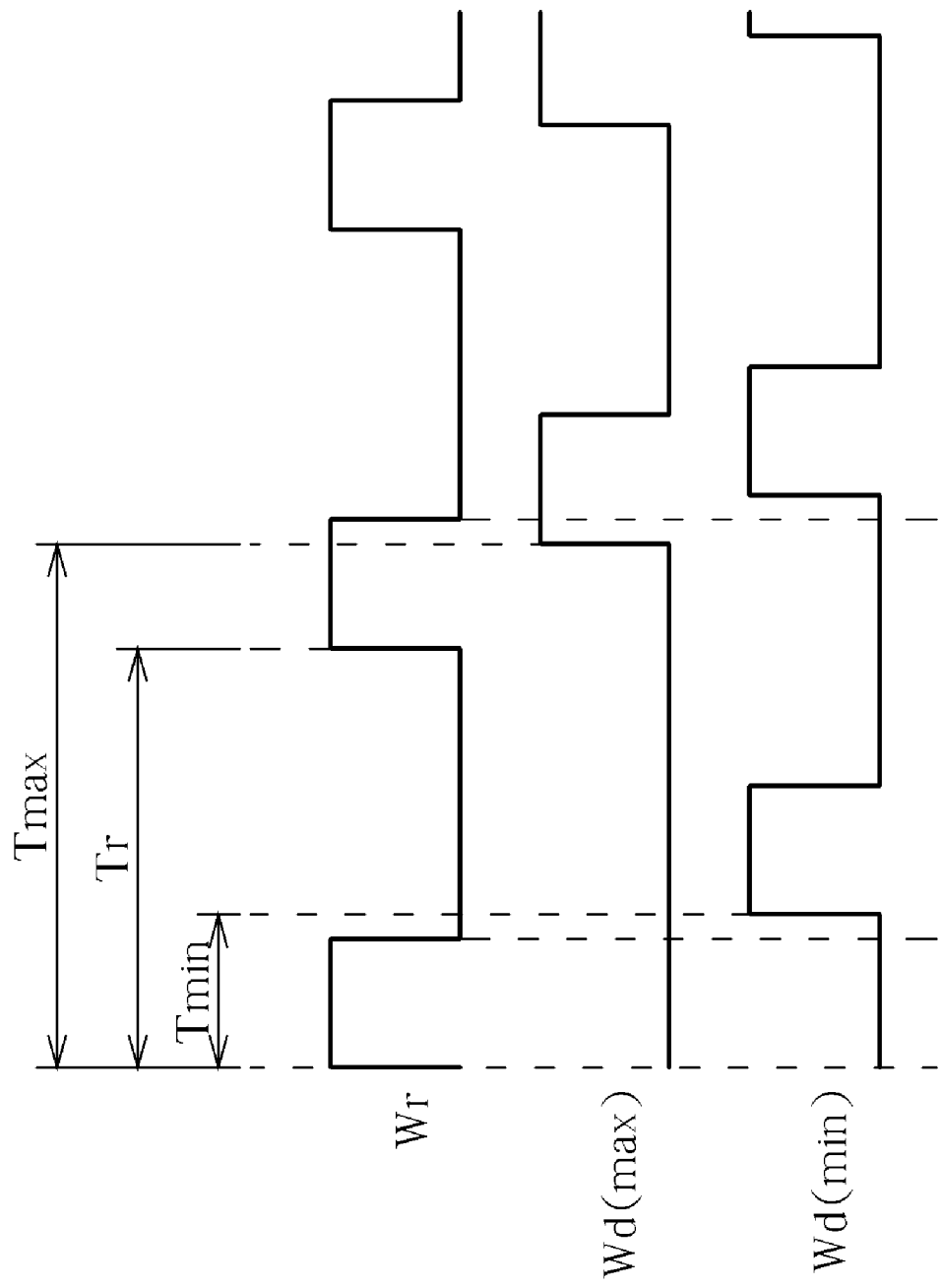
FIG. 2 illustrates a waveform diagram of a lock range of the DLL device in FIG. 1.
Figure 3:
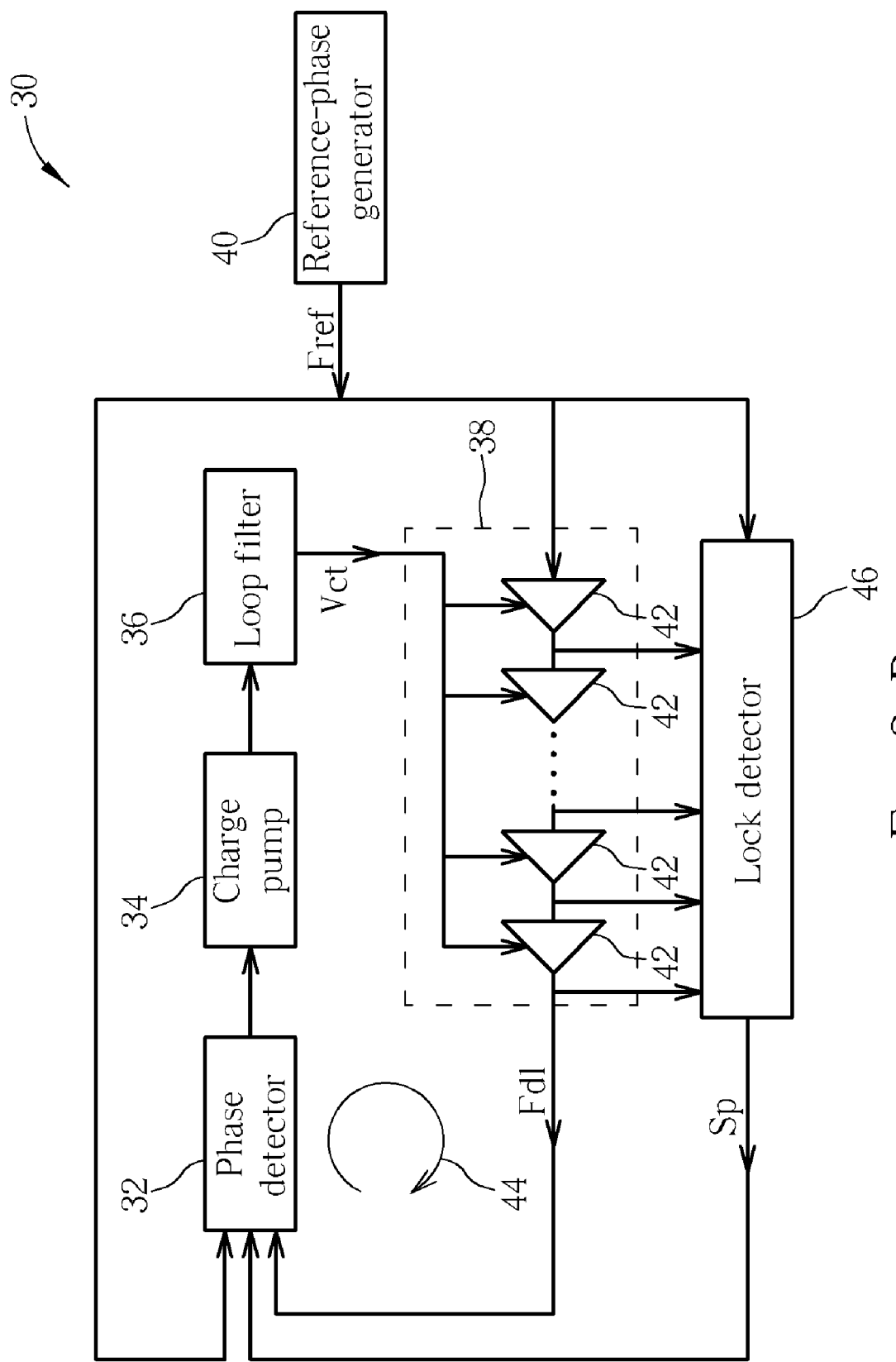
FIG. 3 illustrates a schematic diagram of another prior art DLL device.
Figure 4:
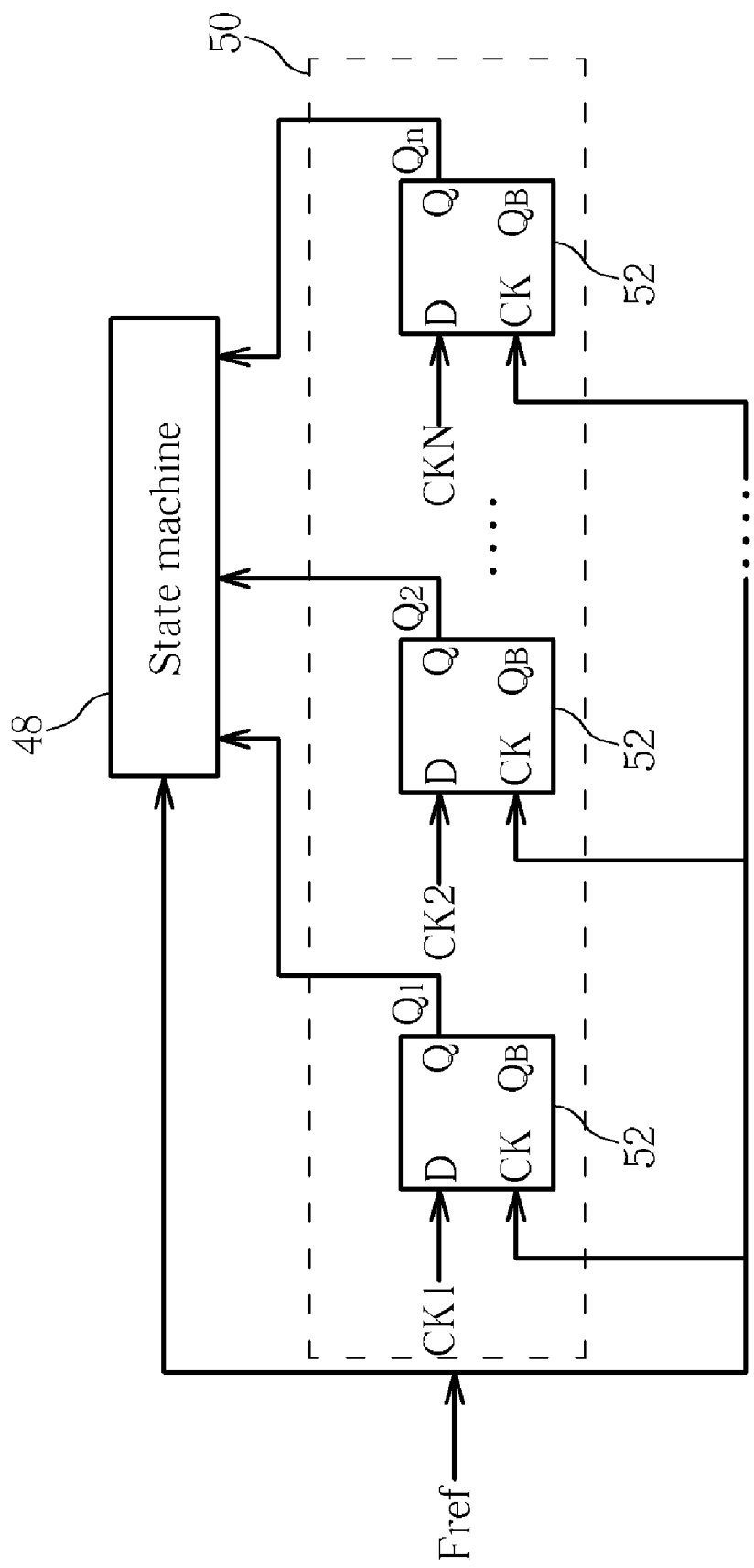
FIG. 4 illustrates a waveform diagram of a lock range of the DLL device in FIG. 3.
Figure 6:
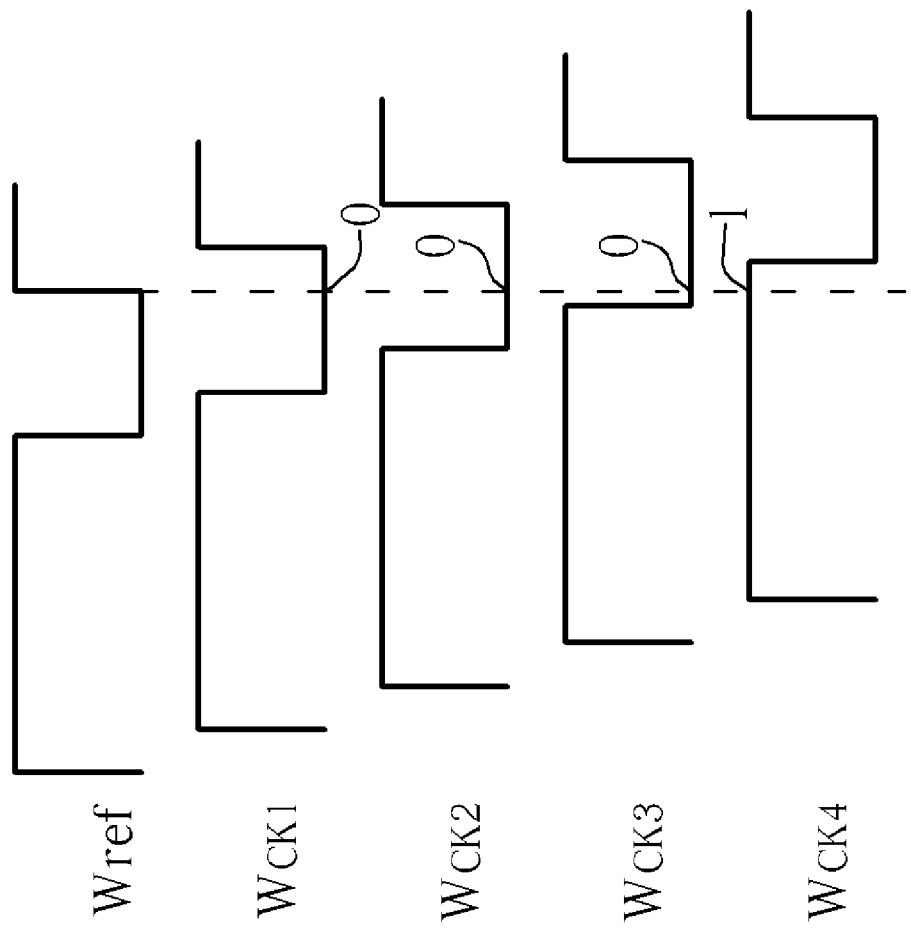
FIG. 6 and FIG. 7 illustrate waveform diagrams of a reference phase and output signals of delay units in FIG. 4.
Figure 7:
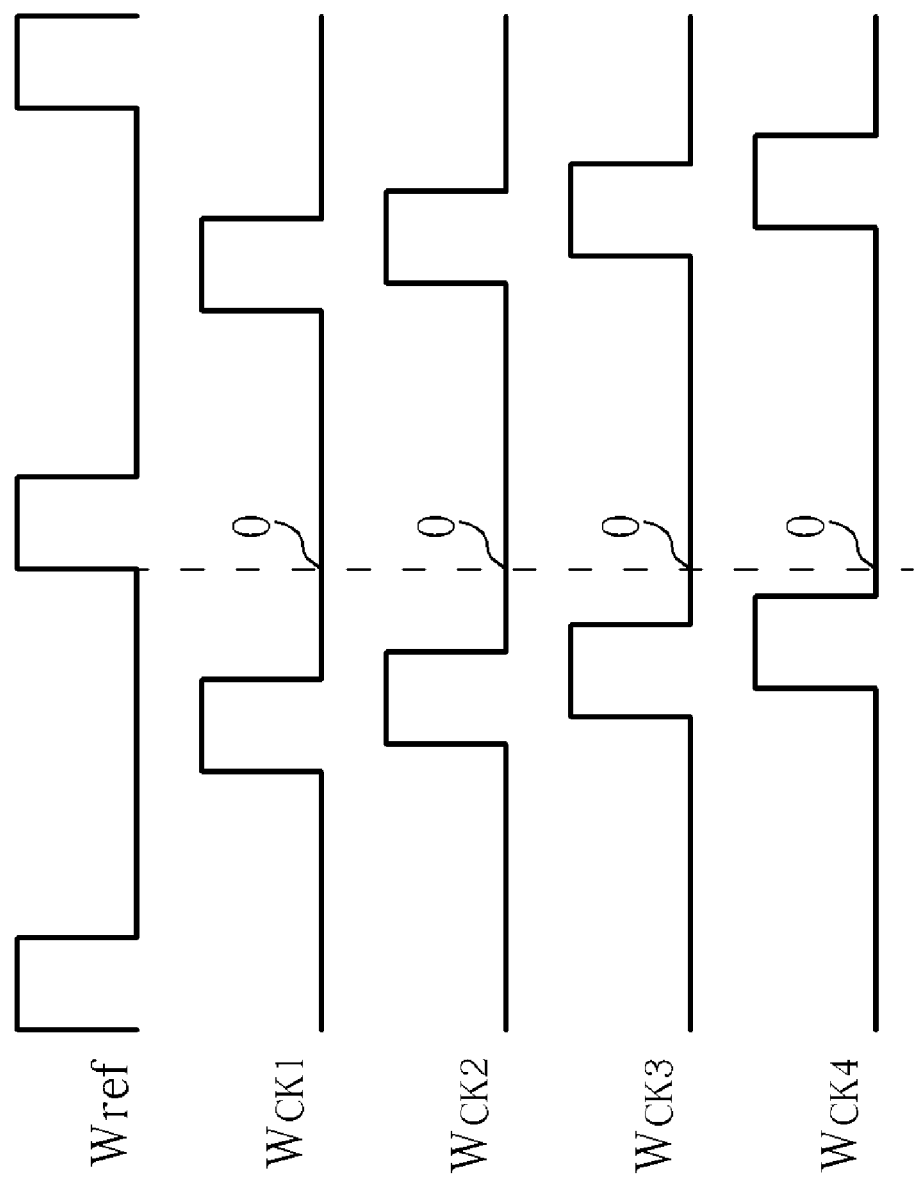
Figure 8:
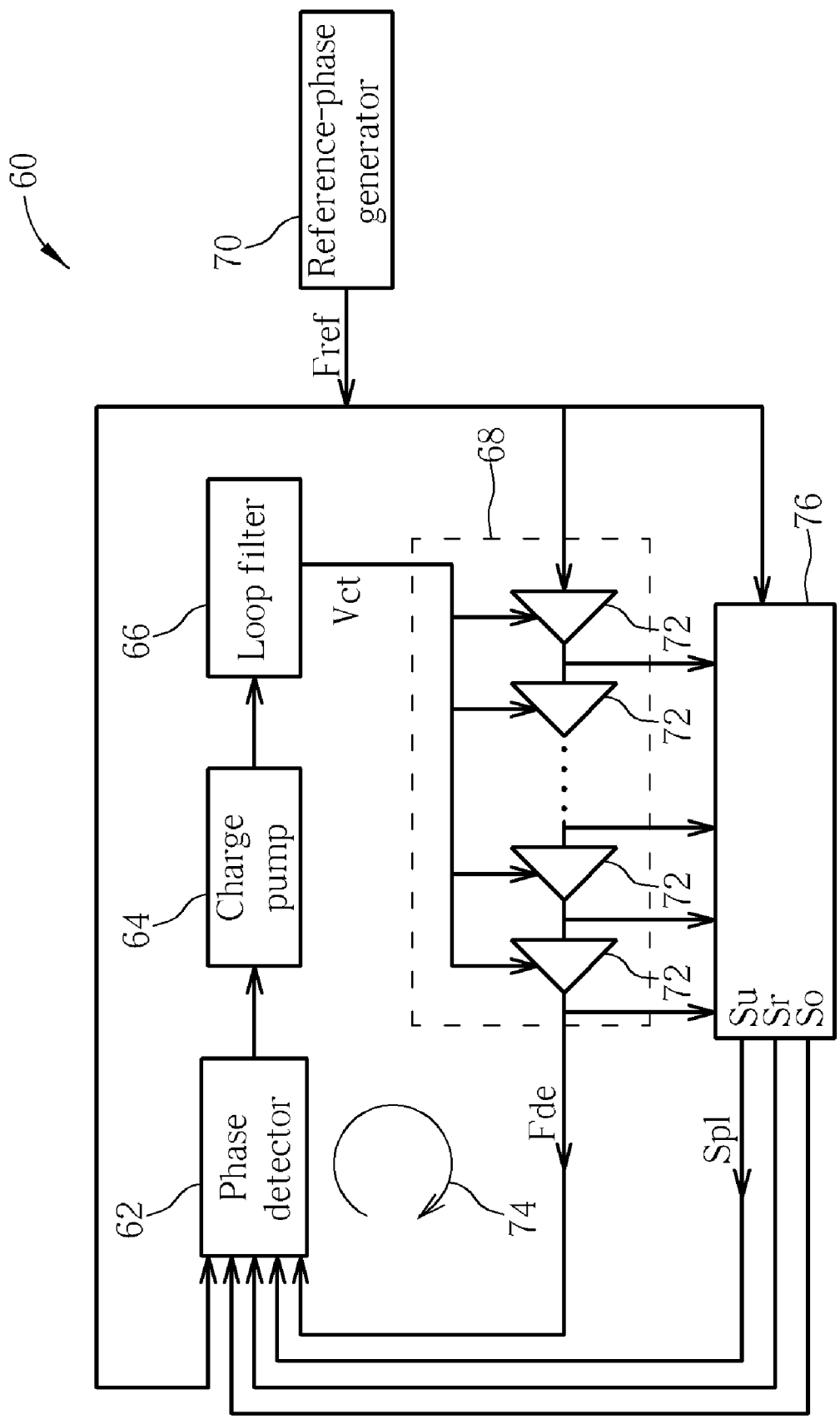
FIG. 8 illustrates a schematic diagram of a DLL device in accordance with the present invention.
Figure 9:
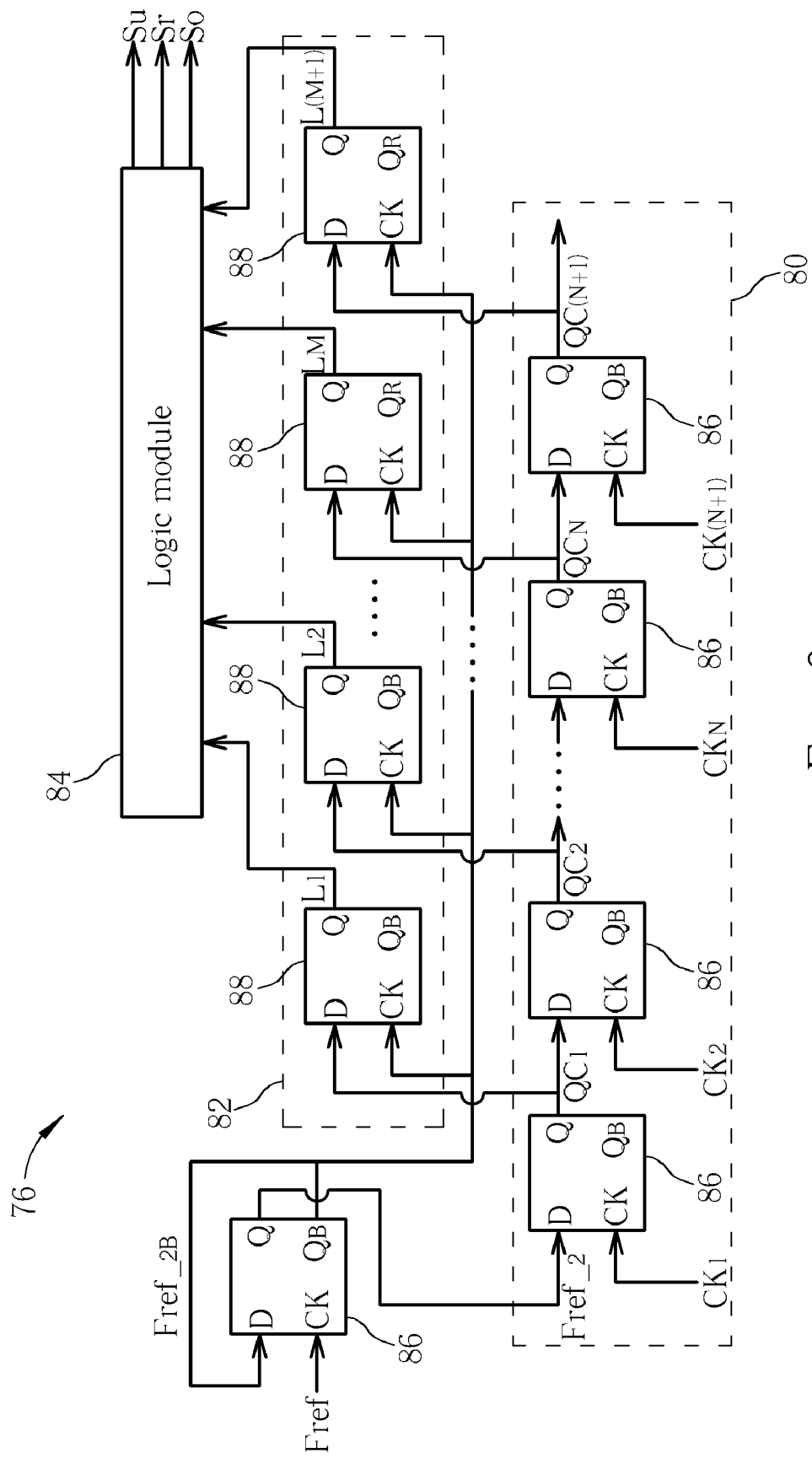
FIG. 9 illustrates a configuration diagram of the lock detector in FIG. 8.
Figure 10:
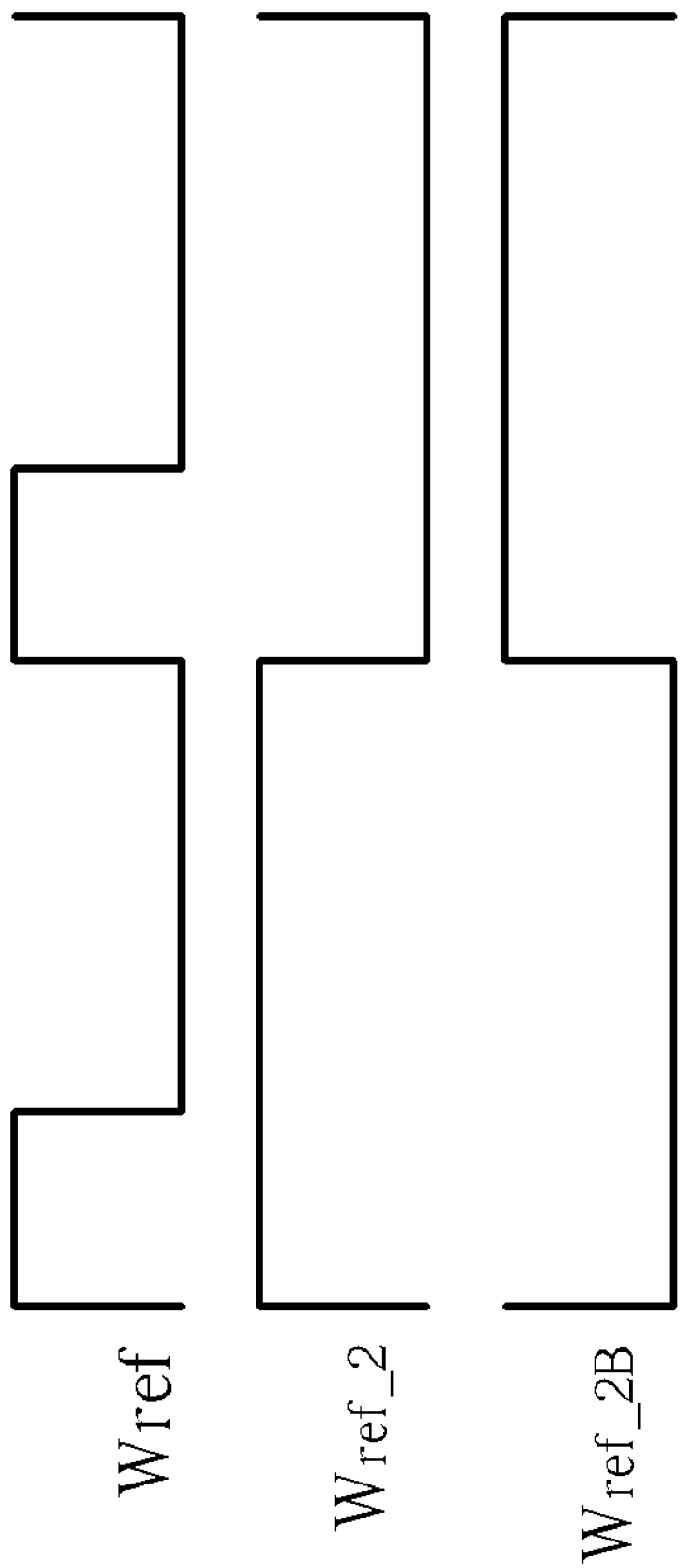
FIG. 10 illustrates a waveform diagram of input/output signals of the frequency divider in FIG. 9.

Please refer to FIG. 8, which illustrates a schematic diagram of a DLL device 60 capable of anti-false-locking in accordance with the present invention. The DLL device 60 includes a phase detector 62, a charge pump 64, a loop filter 66, a voltage control delay circuit 68, a reference-phase generator 70, and a lock detector 76. The voltage control delay circuit 68 includes a plurality of delay units 72 for outputting a delayed phase Fde from the last delay unit 72 to the phase detector 62. The DLL device 60 forms a lock loop 74 according to a lock indication signal Spl provided by the lock detector 76, including an under signal Su, a right signal Sr, and an over signal So. As to a configuration of the lock detector 76, please refer to FIG. 9. In FIG. 9, the lock detector 76 includes a frequency divider 78, a first shift register set 80, a second shift register set 82, and a logic module 84. The first shift register set 80 includes N pieces of D flip-flops 86, while the second shift register set 82 includes M pieces of D flip-flops 88. The frequency divider 78 outputs a first divided phase Fref_2 and a second divided phase Fref_2B according to rising edges of a reference phase Fref provided by the reference-phase generator 70, where frequencies of the first and second divided phases Fref_2 and Fref_2B are half the frequency of the reference phase Fref, and the second divided phase Fref_2B is inverse to the first divided phase Fref_2. As mentioned above, when the duty cycle of the reference phase Fref is not 50%, locking phase would be a problem. The present invention is free from the problem of duty-cycle asymmetry by using the frequency divider 78. Please refer to FIG. 10, which illustrates a waveform diagram of input/output signals of the frequency divider 78 of the lock detector 76, where a waveform Wref, Wref_2, and Wref_2B represent waveforms of the reference phase Fref, the first divided phase Fref_2, and the second divided phase Fref_2B. In FIG. 10, suppose that the duty cycle of the reference phase Fref is 30%. Because the frequency divider 78 is triggered by the rising edges of the reference phase Fref to output the first divided phase Fref_2 and the second divided phase Fref_2B, duty cycles of the first divided phase Fref_2 and the second divided phase Fref_2B are 50%. In FIG. 9, the first-stage D flip-flop 86 of the first shift register set 80 samples the first divided phase Fref_2 with an output signal (or a signal CK1 in FIG. 9) of the first-stage delay unit 72 of the voltage control delay circuit 68, and outputs a comparison signal $QC_1$ to the second-stage D flip-flop 86 of the first shift register set 80 accordingly. Then, the second-stage D flip-flop 86 of the first shift register set 80 samples the comparison signal $QC_1$ with an output signal (or a signal CK2 in FIG. 9) of the second-stage delay unit 72 of the voltage control delay circuit 68, and outputs a comparison signal $QC_2$ to the third-stage D flip-flop 86 of the first shift register set 80 accordingly. By the same token, the first shift register set 80 outputs the comparison signal $QC_1$ through $QC_{N+1}$ to the second shift register set 82 according to the first divided phase Fref_2 and the signals CK1 through CK(N+1) outputted from the delay units 72 of the voltage control delay circuit 68. Each D flip-flop 86 of the second shift register set 82 corresponds to each D flip-flop 86 of the first shift register set 80 for sampling the comparison signals $QC_1$ through $QC_{N+1}$ with the second divided phase Fref_2B, and outputting a sequence of comparison signals L1 through L(M+1). For example, the first-stage D flip-flop 86 of the second shift register set 82 samples the comparison signal $QC_1$ with the second divided phase Fref_2B, and outputs the comparison signal L1. By the same means, the second shift register set 82 samples the sequence of the comparison signals $QC_1$ through $QC_{N+1}$ with the second divided phase Fref_2B, so as to output the comparison signal L1 through L(M+1) to the logic module 84. Then, the logic module 84 can output the lock indication signal Spl according to the comparison signal L1 through L(M+1).

As mentioned above, the stuck lock represents that the delay amount of the delayed phase Fde is smaller than 0.5 cycle in comparison with the reference phase Fref. In the first shift register set 80 of the present invention, the signals CK1 through CK(N+1) outputted from the delay units 72 sample a high-level duration of the first divided phase Fref_2, and in the second shift register set 82, the rising edge of the second divided phase Fref_2B samples the comparison signals $QC_1$ through $QC_{N+1}$ outputted from the first shift register set 80. If stuck lock, the delay amount is small. As a result, the comparison signals L1 through L(M+1) outputted from the second shift register set 82 are high. In short, if stuck lock happens, the cycle of the reference phase Fref is T, and a delay time of each delay unit 72 is Td, relation formulas can be gained as following:

If stuck lock (or Sr=0, Su=1, and So=0), (N×T)<0.5T, N>1

$$\Rightarrow QC_1(t) = Td \quad \text{(Eq. 1)}$$

$$QC_N(t) = N \times Td \quad \text{(Eq. 2)}$$

$$QC_{N+1}(t) = (N+1) \times Td \quad \text{(Eq. 3)}$$

Substitute (N×Td)<0.5T into Eq. 1, 2, and 3.

$$\Rightarrow QC_1(t) = \left(\frac{0.5}{N}\right) \times T$$

$$QC_N(t) = 0.5T$$

$$QC_{N+1}(t) = \left(\frac{0.5}{N}\right) \times T + 0.5T$$

Because the frequency of the first divided phase Fref_2 is half the frequency of the reference phase Fref, durations of the first divided phase Fref_2 corresponding to odd cycles of the reference phase Fref are high, while durations of the first divided phase Fref_2 corresponding to even cycles of the reference phase Fref are low. Then, $$QC_1(t) \sim QC_{N+1}(t) = 1, \; t=T, 3T, 5T, \ldots$$

$$QC_1(t) \sim QC_{N+1}(t) = 0, \; t=2T, 4T, 6T \ldots$$

Therefore, when stuck lock happens (or Sr=0, Su=1, and So=0), L1 through L(M+1) are high.

Figure 11:
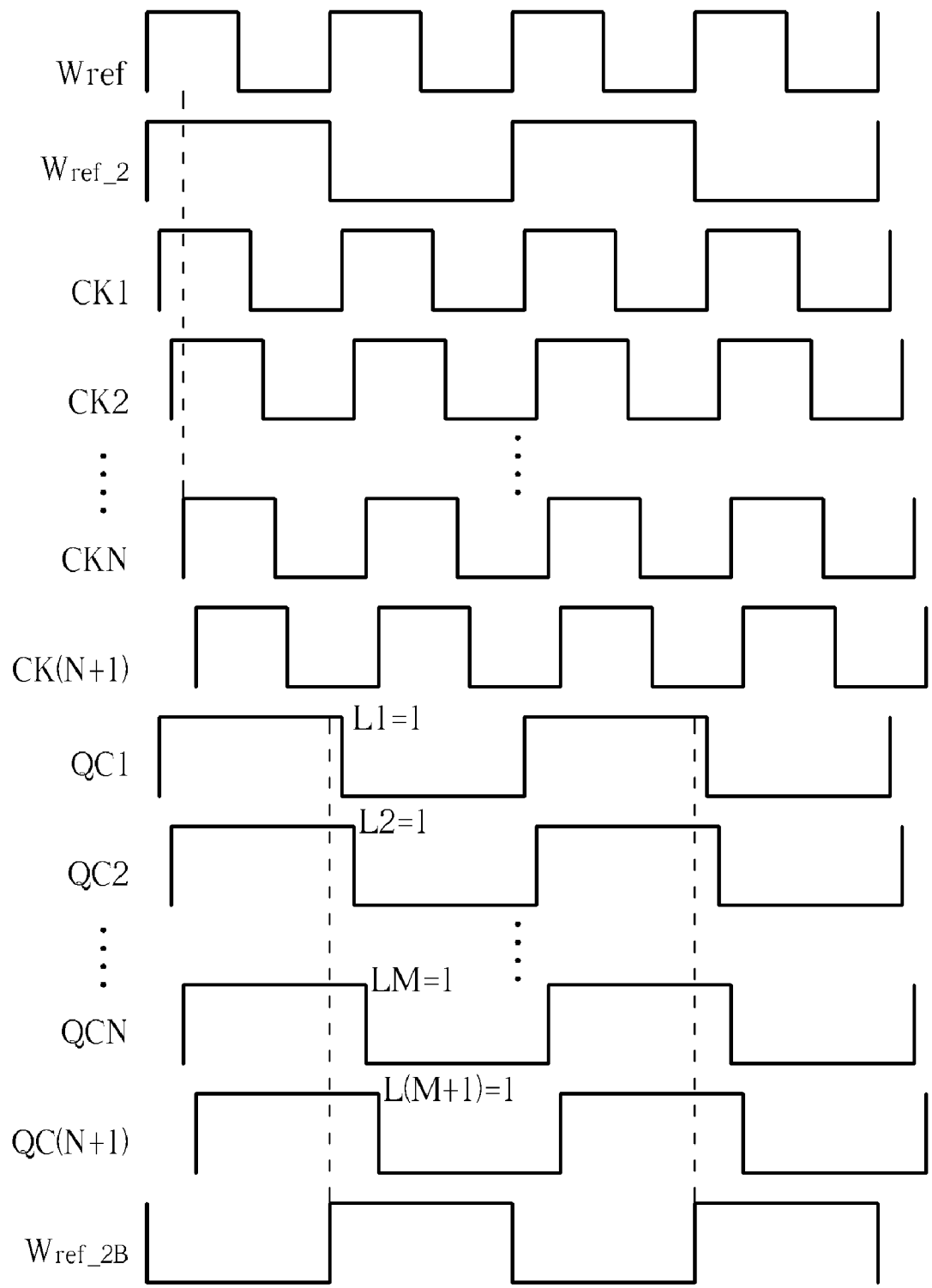
FIG. 11 illustrates a waveform diagram of the present invention DLL device in FIG. 8 when delaying a reference phase with a one-fourth cycle.

For example, if a delay amount 0.25T (T is the cycle of the reference phase Fref) between the delayed phase Fde and the reference phase Fref is needed, the DLL device 60 operates in stuck lock. Please refer to FIG. 11, which illustrates a waveform diagram of the present invention DLL device 60 when delaying the reference phase Fref with a one-fourth cycle. In FIG. 11, the output signals CK1 through CK(N+1) of the delay units 72 of the voltage control delay circuit 68 sample a high-level duration of the first divided phase Fref_2, and outputs the comparison signals $QC_1$ through $QC_{N+1}$. Then, the second divided phase Fref_2B samples the comparison signals $QC_1$ through $QC_{N+1}$, and outputs the logic-1 comparison signals L1 through L(M+1).

By the same token, if right lock happens (or Sr=1, Su=0, and So=0), relation formulas can be gained as following:
if right lock (or Sr=1, Su=0, and So=0), (N×Td)=T
substitute (N×Td)=T into Eq. 1, 2, and 3

$$\Rightarrow QC_1(t) = \frac{T}{N}$$

$$QC_N(t) = T$$

$$QC_{N+1}(t) = \left(\frac{1}{N}\right) \times T + T \text{ and}$$

$$QC_{N-1}(t) = T - \left(\frac{1}{N}\right) \times T,$$

$$QC_{N+1}(t) = T + \left(\frac{1}{N}\right) \times T$$

$$\because QC_1(t) \sim QC_{N+1}(t) = 1, \; t=T, 3T, 5T, \ldots$$

and $QC_1(t) \sim QC_{N+1}(t) = 0$, t=2T,4T,6T, ...

$$\therefore L1=1, L2=1, \ldots, L(M-1)=1, LM=1, L(M+1)=0$$

considering a jitter effect of timer, set Tj=±ε

$$\Rightarrow QC_1(t) = \frac{T}{N} \pm \varepsilon$$

$$QC_{N-1}(t) = T - \left(\frac{1}{N}\right) \times T \pm \varepsilon$$

$$QC_N(t) = T \pm \varepsilon$$

$$QC_{N+1}(t) = \left(\frac{1}{N}\right) \times T + T \pm \varepsilon$$

$$\therefore L1=1, L2=1, \ldots, L(M-1)=1, LM=1 \text{ or } 0, L(M+1)=0$$

Therefore, when the DLL device 60 operates in right lock, L1 through L(M−1) are high, but L(M+1) is low.

In addition, harmonic lock (or Sr=0, Su=0, and So=1) is a situation neither stuck lock nor right lock, so the signal So is gained by a NOR operation of the signals Sr and Su.

Therefore, the present invention DLL device 60 can not only prevent stuck lock and harmonic lock, but increase lock range to $$\frac{T}{N} \sim NT,$$

where N is the number of the delay units 72 of the voltage control delay circuit 68. In other words, when a system demands the delayed phase Fde with a specific delay amount, each delay unit 72 of the voltage control delay circuit 68 delays the reference phase Fref with a fixed amount, and the last delay unit 72 outputs the delayed phase Fde to the lock detector 76. The frequency divider 78 of the lock detector 76 outputs the first divided phase Fre_2 to the first shift register set 80 and the second divided phase Fref_2B to the second shift register set 82 according to the reference phase Fref. The frequency divider 78 is triggered by the rising edges of the reference phase Fref, which makes sure that the duty cycles of the first divided phase Fref_2 and the second divided phase Fref_2B are 50%. Then, the first D flip-flop 86 of the first shift register set 80 samples the first divided phase Fref_2 with the output signal of the first delay unit 72 of the voltage control delay circuit 68, and outputs the comparison signal $QC_1$ to the second D flip-flop 86 of the first shift register set 80 and the first D flip-flop 88 of the second shift register set 82 accordingly. By the same token, the first shift register set 80 outputs the comparison signals $QC_1$ through $QC_{N+1}$ to the second shift register set 82. Then, the D flip-flops 88 of the second shift register set 82 sample the comparison signals $QC_1$ through $QC_{N+1}$ with the second divided phase Fref_2B, and output the comparison signals L1 through L(M+1) to the logic module 84. The logic module 84 generates the signals Su, Sr, and So for the phase detector 62 with the simple relation formulas according to the comparison signals L1 through L(M+1). Comparing to the prior art the present invention prevents stuck lock and harmonic lock, increases the lock range to $$\frac{T}{N} \sim NT,$$

and broadens operating scope. In addition, the present invention is free from error lock decision owing to the duty-cycle asymmetry of the reference phase Fref. Also, when the delay units 72 are increased for high-precision operations, the present invention does not require a truth table for storing a new logic, but increases the lock range as the delay units 72 increase. For example, if the voltage control delay circuit 68 includes four delay units 72 the present invention DLL device 60 provides a lock range from 0.25T through 4T, instead of from 0.5T through 1.5T of the prior art DLL device 30.

Figure 12:
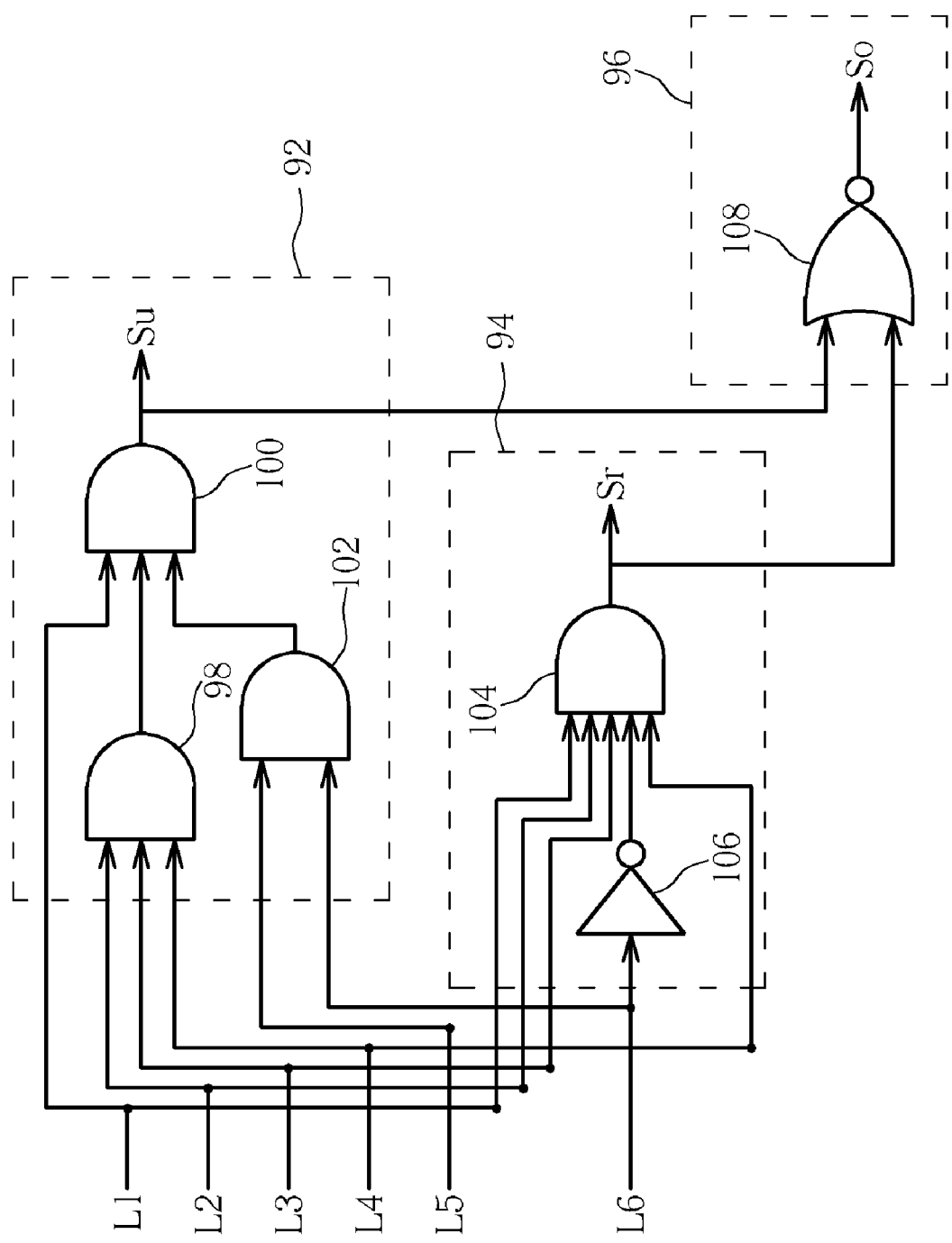
FIG. 12 illustrates a block diagram of a preferred embodiment logic module in FIG. 8.

Because the logic module 84 outputs the lock indication signal Spl based on the sample relation formulas, the logic module 84 can be implemented with a simple circuit. Please refer to FIG. 12, which illustrates a block diagram of a preferred embodiment logic module 90 of the lock detector when the voltage control delay circuit 68 of the DLL device 60 includes six delay units 72. The logic module 90 includes a stuck lock decision module 92, a right lock decision module 94, and a harmonic lock logic module 96. The stuck lock decision module 92 includes three pieces of AND gates 98, 100, and 102 for determining that if the comparison signals L1 through L6 are logic 1, the over signal Su is logic 1, otherwise, the over signal Su is logic 0. The right lock decision module 94 includes an AND gate 104 and a NOT gate 106. According to the comparison signals L1 through L4 and L6 (where L5 does not affect the result), the right decision module 94 determines that if the comparison signals L1 through L4 are logic 1, and the comparison signal L6 is logic 0, the right signal Sr is logic 1, otherwise, if one of the comparison signals L1 through L4 is not logic 1 or the comparison signal L6 is not logic 0, the right signal Sr is logic 0. The harmonic lock logic module 96 includes a NOR gate 108 for determining that if the signals Su and Sr are logic 1, the over signal So is logic 1, otherwise, the signal is logic 0. Therefore, if stuck lock happens, the comparison signals L1 through L(M+1) are logic 0; if right lock happens, the comparison signals L1 through L(M−1) are logic 1, but the comparison signal L(M+1) is logic 0, where the comparison signal LM does not affect the result for preventing the jitter effect of timer; if harmonic lock happens, neither stuck lock nor right lock is determined. Depending on the above logic, the present invention can prevent false lock.

In short, the present invention improves the duty-cycle asymmetry of the reference phase Fref by triggering the frequency divider 78 of the lock detector 76 with the rising edges of the reference phase Fref to output the first and the second divided phases Fref_2, and Fref_2B. Then, the first shift register set 80 of the lock detector 76 generates the comparison signals $QC_1$ through $QC_{N+1}$ for the second shift register set 82 according to the output signals of the delay units 72 and the first divided phase Fref_2, and the second shift register set 82 generates the comparison signals L1 through L(M+1) for the logic module 84 according to the comparison signals $QC_1$ through $QC_{N+1}$ and the second divided phase Fref_2B. The logic module 84 formed by the AND gate, the NOT gate, and the NOR gate generates the lock indication signal SpI for the phase detector 62 according to the relation formulas. Finally, the phase detector 62 maintains the lock loop according to the lock indication signal Spl.

In summary, high-speed/precision, and multi-function operations have been basic requirements of an integrated circuit. The present invention maintains synchronization of units or devices of a system with the lock indication signal provided by the lock detector. The frequency divider of the lock detector, the first and the second shift register sets are formed by D flip-flops. As those skilled in the art recognize, there is no fixed circuit for forming a D flip-flop as long as the D flip-flop is capable of sampling an input signal of a D terminal with an input signal of a CK terminal and generating a corresponding output. Also, the AND gate, the NOT gate, and the NOR gate of the logic module of the lock detector in the present invention is formed without specific circuits but with the said digital operations. The present invention can prevent stuck lock and harmonic lock, provide the larger lock range than the prior art, and improve duty-cycle asymmetry of the reference phase. Most important of all, the present invention does not require calculating a truth table, so the device for storing the truth table is unnecessary even if the delay units of the voltage control delay circuit are increased. Therefore, the present invention improves the drawbacks of the prior art with simple logic circuits and lower system resources.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay-locked loop device capable of anti-false-locking, comprising:
   a voltage control delay circuit comprising a plurality of delay units in a series for generating a delayed phase according to a reference phase and a control voltage;
   a phase detector coupling to the voltage control delay circuit for generating a control signal according to a lock indication signal, the reference phase, and the delayed phase;
   a charge pump coupling to the phase detector for generating the control voltage to the voltage control delay circuit according to the control signal;
   a lock detector coupling to the voltage control delay circuit for generating the lock indication signal for the phase detector according to output phases of each delay unit of the voltage control delay circuit, comprising:
      a first shift register set comprising a plurality of shift registers each corresponding to a delay unit of the voltage control delay circuit for generating a first sequence of comparison signals according to a first divided phase and the output phases of each delay unit of the voltage control delay circuit;
      a second shift register set comprising a plurality of shift registers each corresponding to a shift register of the first shift register set for generating a second sequence of comparison signals according to a second divided phase and the first sequence of the comparison signals; and
      a logic module coupling to the second shift register set for generating the lock indication signal according to the second sequence of the comparison signals.

2. The DLL device of claim 1, wherein the lock detector further comprises a frequency divider for generating the first divided phase and the second divided phase with frequencies being half a frequency of the reference phase according to the reference phase.

3. The DLL device of claim 2, wherein the second divided phase is inverse to the first divided phase.

4. The DLL device of claim 1, further comprising a loop filter coupling to the charge pump for transforming charges provided by the charge pump into the control voltage for the voltage control delay circuit.

5. The DLL device of claim 1, further comprising a reference-phase generator for generating the reference phase.

6. The DLL device of claim 1, wherein the voltage control delay circuit delays the reference phase according to a predetermined delayed phase.

7. The DLL device of claim 1, wherein the plurality of the shift registers of the first shift register set and the second shift register set are D flip-flops.

* * * * *